United States Patent
Hsu et al.

(10) Patent No.: US 11,398,268 B1
(45) Date of Patent: Jul. 26, 2022

(54) MEMORY DEVICE AND OPERATION METHOD FOR THE SAME

(71) Applicant: MACRONIX INTERNATIONAL CO., LTD., Hsinchu (TW)

(72) Inventors: Po-Kai Hsu, Tainan (TW); Teng-Hao Yeh, Zhubei (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/321,664

(22) Filed: May 17, 2021

Related U.S. Application Data

(60) Provisional application No. 63/144,967, filed on Feb. 2, 2021.

(51) Int. Cl.
| | |
|---|---|
| *G11C 8/00* | (2006.01) |
| *G11C 11/408* | (2006.01) |
| *G11C 11/4074* | (2006.01) |
| *H03K 19/017* | (2006.01) |
| *G11C 5/06* | (2006.01) |
| *G11C 15/04* | (2006.01) |

(52) U.S. Cl.
CPC ............ *G11C 11/4085* (2013.01); *G11C 5/06* (2013.01); *G11C 11/4074* (2013.01); *G11C 15/04* (2013.01); *H03K 19/01742* (2013.01)

(58) Field of Classification Search
CPC ................................................ H03K 19/01742
USPC .................................................... 365/230.06
See application file for complete search history.

(56) References Cited

U.S. PATENT DOCUMENTS

| | | | | |
|---|---|---|---|---|
| 6,731,526 B2* | 5/2004 | Inoue | .................. | G11C 15/043 |
| | | | | 365/49.17 |
| 6,792,502 B1* | 9/2004 | Pandya | .................. | G11C 15/00 |
| | | | | 370/395.51 |
| 6,842,359 B2* | 1/2005 | Hata | ...................... | G11C 15/00 |
| | | | | 365/203 |
| 7,120,732 B2* | 10/2006 | Braceras | ................ | G11C 15/00 |
| | | | | 365/49.16 |
| 7,350,137 B2* | 3/2008 | Foss | ....................... | G11C 15/00 |
| | | | | 714/805 |
| 7,401,180 B1* | 7/2008 | James | .................... | G11C 15/00 |
| | | | | 365/49.1 |
| 7,894,227 B2* | 2/2011 | Inoue | .................... | G11C 15/04 |
| | | | | 365/49.1 |
| 9,672,912 B2* | 6/2017 | Matsuoka | ............. | G11C 15/04 |
| 9,728,259 B1 | 8/2017 | Jung et al. | | |

(Continued)

*Primary Examiner* — Viet Q Nguyen
(74) *Attorney, Agent, or Firm* — McClure, Qualey & Rodack, LLP

(57) ABSTRACT

A three-dimension (3D) memory device and an operation method thereof are provided. The 3D memory device includes: a memory array including a plurality of memory cells; a controller coupled to the memory array; and a match circuit coupled to memory array, wherein in data search and match, the controller selects from the memory cells a plurality of target memory cells sharing a same target global signal line, and the controller selects a plurality of target word lines sharing the target global signal line as a plurality of target search lines, wherein a search data sends to the target memory cells via the target search lines for data matching; the target global signal line is precharged; and outputting a match address based on whether a voltage on the target global signal line is pulled down or not.

14 Claims, 19 Drawing Sheets

(56) References Cited

U.S. PATENT DOCUMENTS

| | | | |
|---|---|---|---|
| 10,262,720 B2 * | 4/2019 | Nii | G11C 11/4097 |
| 10,922,020 B2 * | 2/2021 | Akel | G06F 3/0659 |
| 11,107,511 B2 * | 8/2021 | Park | G11C 15/04 |
| 11,107,531 B2 * | 8/2021 | Kim | G11C 15/04 |
| 2006/0020397 A1 * | 1/2006 | Kermani | G16B 30/00 |
| | | | 702/20 |
| 2008/0151588 A1 | 6/2008 | Agarwal et al. | |
| 2011/0026288 A1 * | 2/2011 | Watanabe | G11C 15/04 |
| | | | 365/49.17 |
| 2015/0332767 A1 * | 11/2015 | Arsovski | G11C 15/04 |
| | | | 365/49.17 |
| 2016/0172037 A1 * | 6/2016 | Lee | G11C 16/26 |
| | | | 365/185.12 |

* cited by examiner

SD=10100

| 0 | 1 | 1 | 0 | 1 |
|---|---|---|---|---|
| 0 | 1 | 1 | 1 | 0 |
| 1 | 0 | 1 | 0 | 0 |
| 1 | 0 | 0 | 1 | 1 | match → (row 3)

SD=01100

| 0 | 1 | 1 | 0 | × |
|---|---|---|---|---|
| 0 | 1 | 1 | × | × |
| 1 | 0 | 1 | × | × |
| 1 | 0 | 0 | 1 | 1 | match → (row 1)

FIG. 2

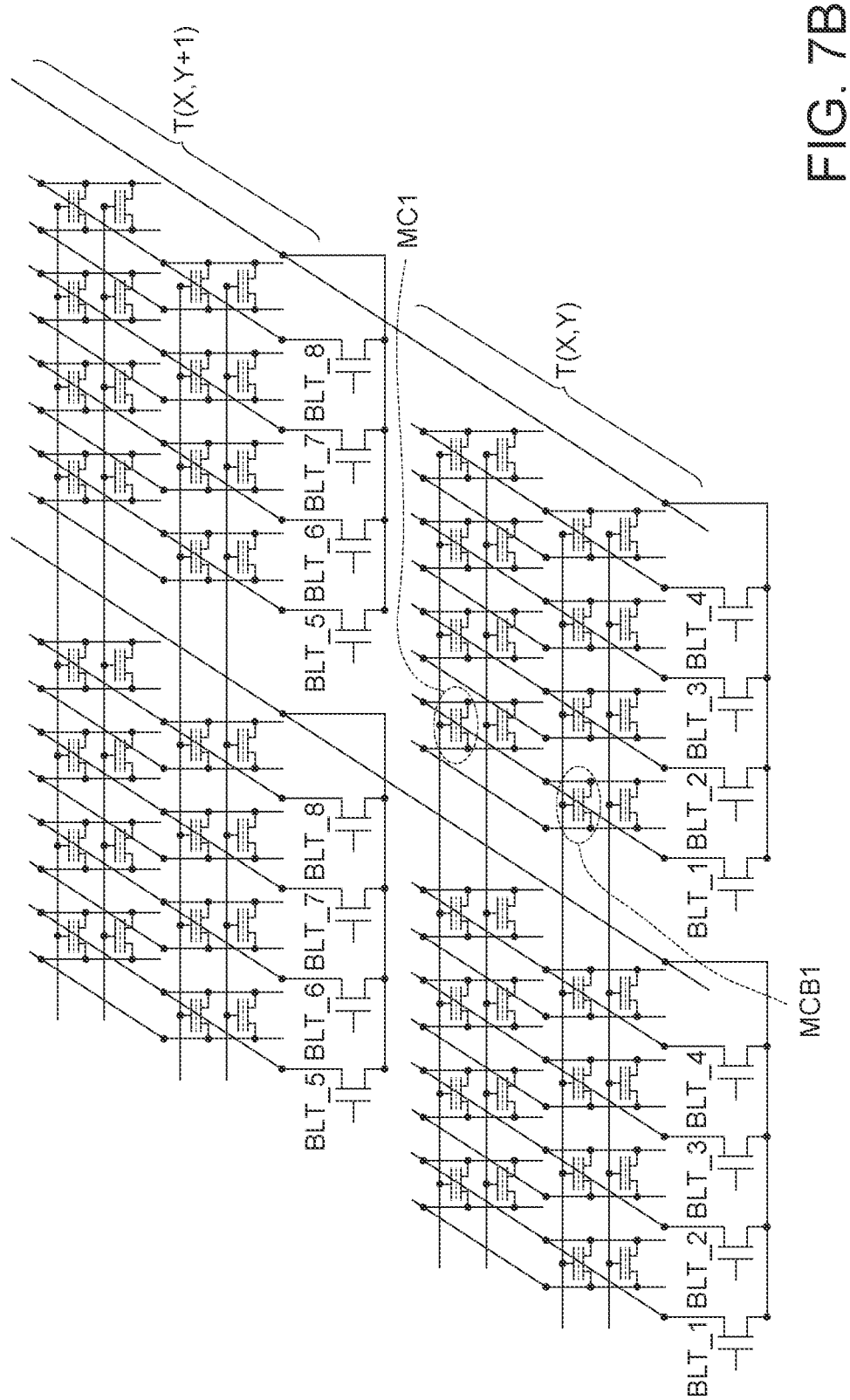

MEMORY DEVICE AND OPERATION METHOD FOR THE SAME

This application claims the benefit of U.S. provisional application Ser. No. 63/144,967, filed Feb. 2, 2021, the subject matter of which is incorporated herein by reference.

TECHNICAL FIELD

The disclosure relates in general to a memory device and an operation method for the same.

BACKGROUND

Content-addressable memory (CAM) is a special type of computer memory used in certain very-high-speed searching applications. In content addressing, the memory compares input search data against stored data, and returns the address of matching data. CAM is used in networking devices where it speeds information forwarding and returning.

Nonvolatile memories are able to save data movements and thus are energy-efficient and rapid information return. Nonvolatile memories are used to implement TCAM (ternary content addressable memory) function. Traditional NOR flash memories have good device characteristics but low storage density.

On the contrary, 3D AND flash memories provide high storage density and good device characteristics. 3D AND flash memories are used in implementing TCAM memory arrays.

However, how to provide high efficient memory devices is a major issue.

SUMMARY

According to one embodiment, provided is a three-dimension (3D) memory device, comprising: a memory array including a plurality of memory cells; a controller coupled to the memory array; and a match circuit coupled to memory array, wherein in data search and match, the controller selects from the memory cells a plurality of target memory cells sharing a same target global signal line, and the controller selects a plurality of target word lines sharing the target global signal line as a plurality of target search lines, wherein a search data sends to the target memory cells via the target search lines for data matching; the target global signal line is precharged; and outputting a match address based on whether a voltage on the target global signal line is pulled down or not.

According to another embodiment, provided is an operation method for a three-dimension (3D) memory device, comprising: in data search and match, selecting a plurality of target memory cells sharing a same target global signal line, and selecting a plurality of target word lines sharing the target global signal line as a plurality of target search lines, wherein a search data sends to the target memory cells via the target search lines for data matching; precharging the target global signal line; and outputting a match address based on whether a voltage on the target global signal line is pulled down or not.

BRIEF DESCRIPTION OF THE DRAWINGS

FIG. 2 shows one example of data search according to one embodiment of the application.

FIG. 7A to FIG. 7C show examples of selecting the memory cells as the data search objects in multi-bit search according to embodiments of the application.

Figure 1:
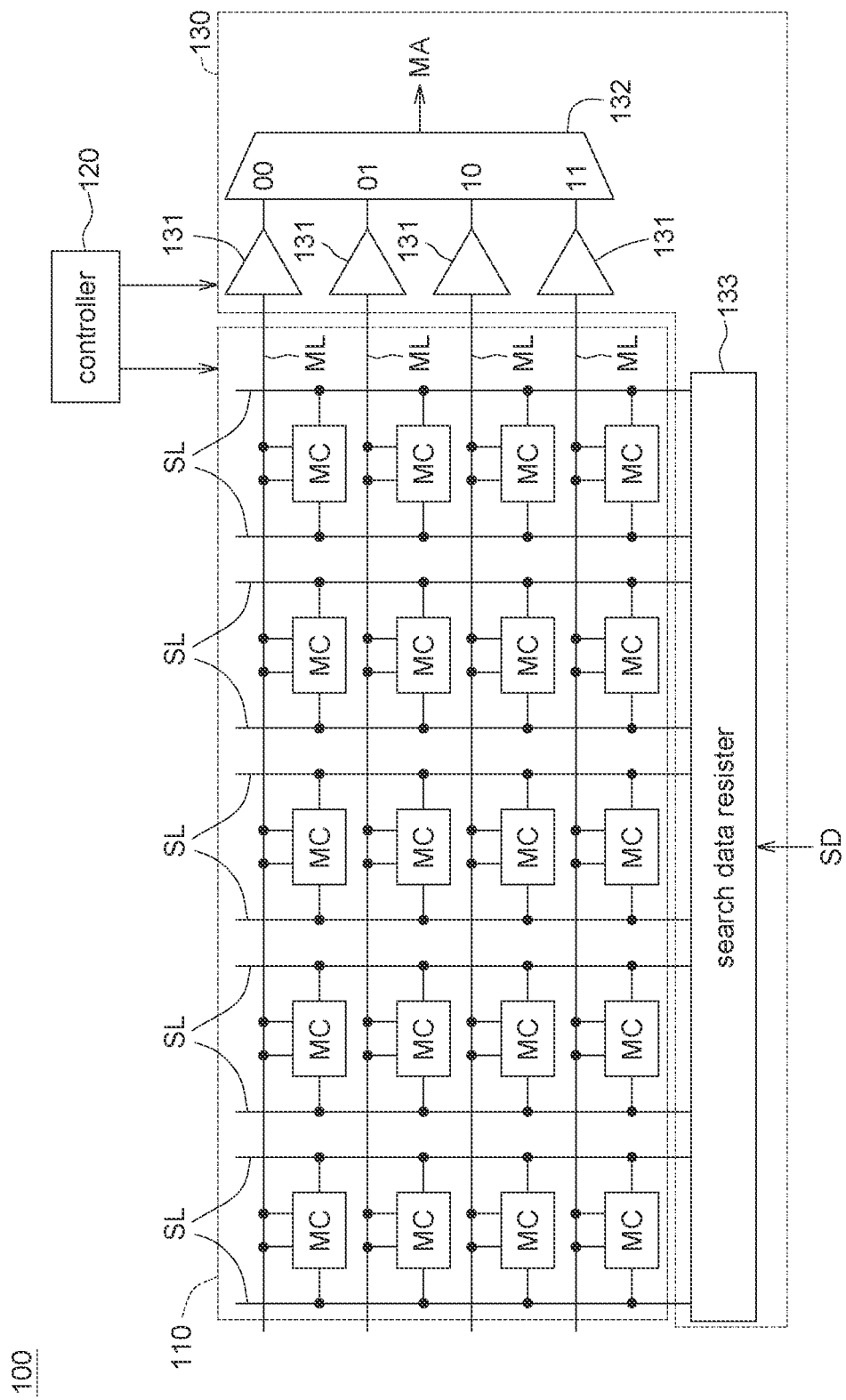
FIG. 1 shows a circuit diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Now refer to FIG. 1 which shows a circuit diagram of a memory device 100 according to one embodiment of the application. The memory device 100 includes a memory array 110, a controller 120 and a match circuit 130. The memory array 110 is coupled to the controller 120 and the match circuit 130. The memory device 100 may implement the TCAM functions. In embodiments of the application, the memory device 100 and the memory array 110 are three-dimension (3D) structure. Thus, in embodiments of the application, the memory device 100 and the memory array 110 have flexible functions and operations.

The memory array 110 includes a plurality of memory cells MC arranged in an array. The memory cells MC may be programmed or erased. In the following, the programmed memory cell MC stores logic 1 while the erased memory cell MC stores logic 0, but the application is not limited by this.

The controller 120 controls the memory array 110 and the match circuit 130 for performing data search and data match.

The match circuit 130 includes a plurality of sensing amplifiers 131, an address encoder 132 and a search data register 133. The sensing amplifiers 131 are coupled to the memory cells MC of the memory array 110 via a plurality of match lines ML, for sensing whether the memory cells generate cell currents. For example, when a search result for the memory cell MC is matched, then the matched memory cell MC does not generate any cell current. On the contrary, when a search result for the memory cell MC is mismatched, then the mismatched memory cell MC generates the cell current.

The address encoder 132 is coupled to the sensing amplifiers 131 for generating a match address MA based on the sensing results of the sensing amplifiers 131. When the memory cell MC does not generate any cell current (i.e. the search result for the memory cell MC is matched), the address encoder 132 generates the match address MA wherein the match address MA indicates an address of the matched memory cell.

The search data register 133 is for registering the search data SD for sending to the memory array 110 for data match. The search data register 133 is coupled to the memory cells MC via the search lines SL for sending the data to the memory cells MC for data match.

FIG. 2 shows one example of data search according to one embodiment of the application. The application is not limited by this.

As shown in FIG. 2, when the search data SD is 10100, the search results for the third row is matched because the storage data in the memory cells on the third row is 10100; and the search results of other rows are mismatched. When the search data SD is 01100, the search results for the first row is matched because the storage data in the memory cells on the first row is 0110X ("X referring to don't care, being logic 1 or logic 0"); the search results for the second row is matched because the storage data in the memory cells on the second row is 011XX; and the search results for the third and fourth rows are mismatched. In TCAM operations, the row having most matched bits is selected as the final match result. As shown in FIG. 2, in searching 01100, the first row has four matched bits while the second row has three matched bits; and thus the first row is selected as the final match result (the preferred result).

In TCAM operations, the search is more flexible by using X bit (don't care bit).

In data search and match, all rows are parallel searched and the preferred result is returned as the matched address MA.

Figure 3:
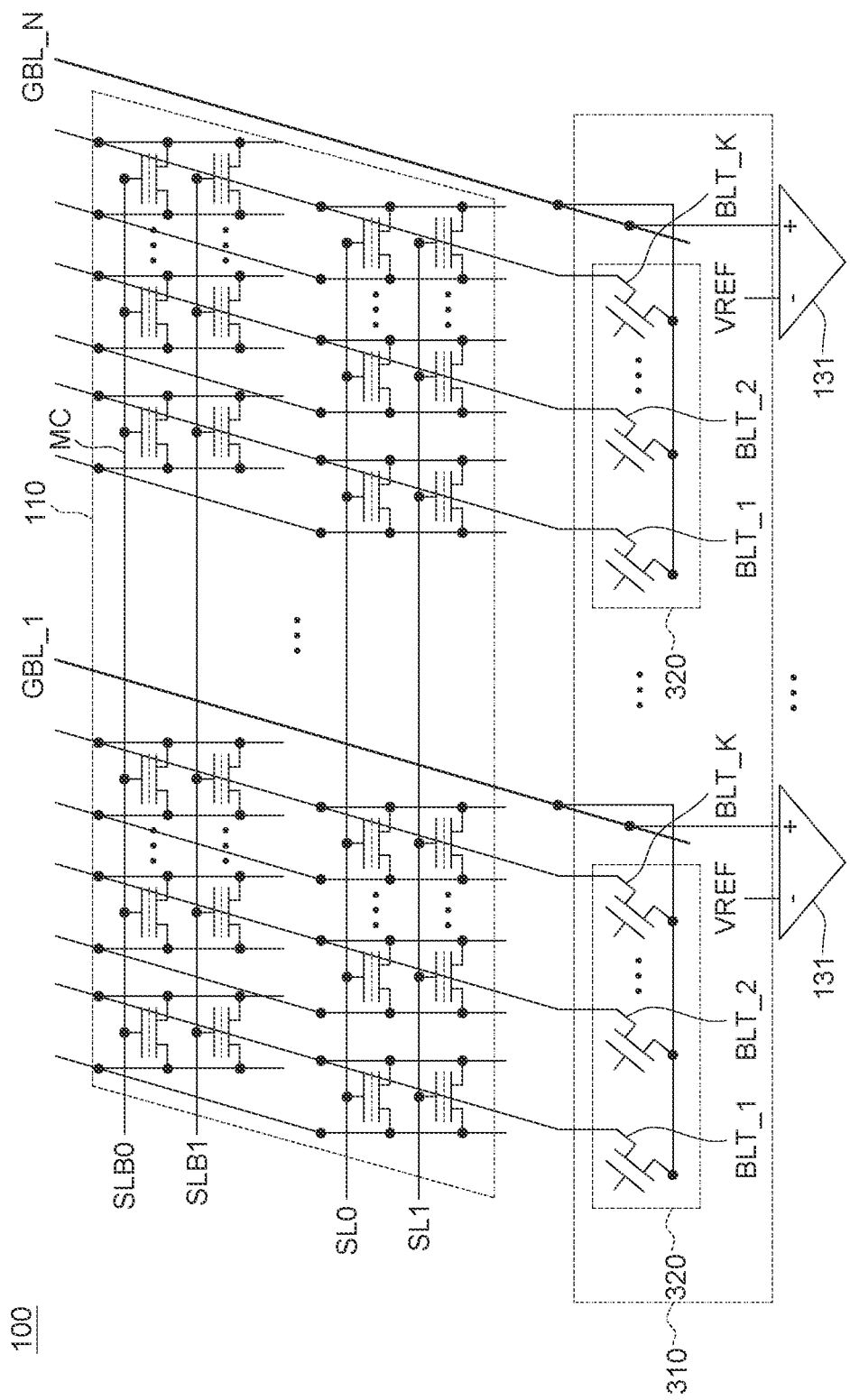
FIG. 3 shows a circuit diagram of the memory device according to one embodiment of the application.

FIG. 3 shows a circuit diagram of the memory device 100 according to one embodiment of the application. As shown in FIG. 3, the memory device 100 further includes a local bit line decoder 310 including a plurality of bit line transistor groups 320. Each of the bit line transistor groups 320 includes bit line transistors BLT_1~BLT_K (K being a positive integer). The bit line transistors BLT_1~BLT_K are coupled between the memory cells MC and the sensing amplifiers 131. The lines SL0, SLB0, SL1 and SLB1 are search lines. In one embodiment, the word lines are used as the search lines (SL) while the global bit lines GBL_1~GBL_N (N being a positive integer) as used as the match lines (ML). The global bit lines GBL_1~GBL_N are also referred as the global signal lines.

As described above, when the search result for the memory cell MC is matched, the memory cell MC does not generate the cell current; and when the search result for the memory cell MC is mismatched, the memory cell MC generates the cell current. The cell current from the mismatched memory cell MC pulls down the voltage on one of the global bit lines GBL_1~GBL_N via the bit line transistors BLT_1~BLT_K, wherein in the search operations, the global bit lines GBL_1~GBL_N are precharged to high level in advance. The sensing amplifiers 131 compare the voltages on the global bit lines GBL_1~GBL_N with a reference voltage VREF. When the voltage on the global bit lines GBL_1~GBL_N is higher than the reference voltage VREF (which means the search result for the row is matched), the sensing amplifiers 131 output a match result to the address encoder 132 and thus the address encoder 132 generates the match address MA. On the contrary, when the voltage on the global bit lines GBL_1~GBL_N is lower than the reference voltage VREF (which means the search result for the row is mismatched), the sensing amplifiers 131 does not output the match result to the address encoder 132.

Figure 4:
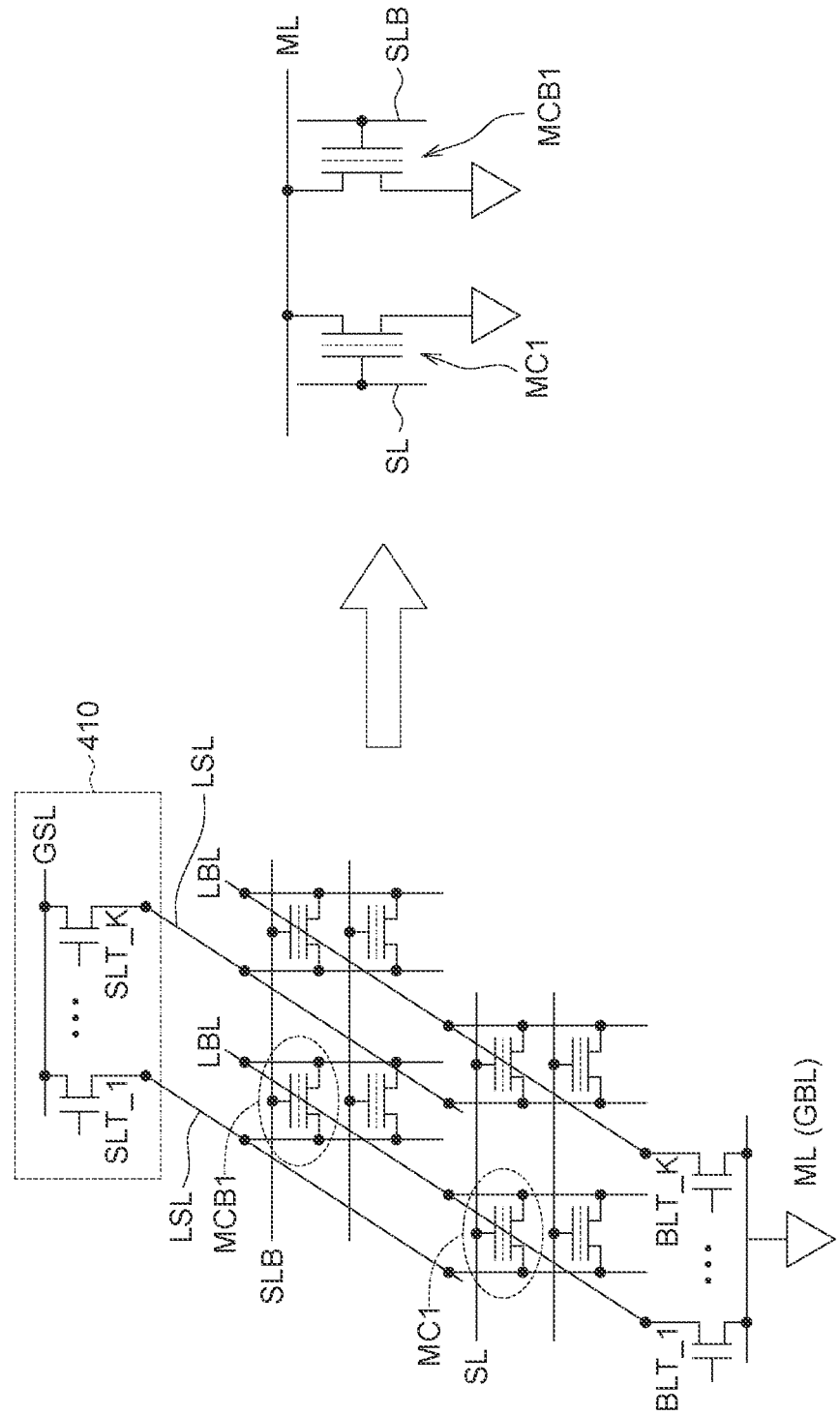
FIG. 4 shows a circuit diagram and the simplifier circuit diagram of the memory device according to one embodiment of the application.

FIG. 4 shows a circuit diagram and the simplifier circuit diagram of the memory device 100 according to one embodiment of the application. As shown in FIG. 4, the memory device 100 further includes a local source line decoder 410 including a plurality of source line transistors SLT_1~SLT_K. Taking the source line transistor SLT_1 as an example, the source line transistor SLT_1 includes a terminal coupled to the global source line GSL, another terminal coupled to the local source line LSL and a control terminal receiving a control signal (not shown) from the controller 120. Other source line transistors SLT_2~SLT_K have similar coupling relationships.

Similarly, taking the bit line transistor BLT_1 as an example, the bit line transistor BLT_1 includes a terminal coupled to the global bit line GBL (i.e. the match line ML), another terminal coupled to the local bit line LBL and a control terminal receiving a control signal (not shown) from the controller 120. Other bit line transistors BLT_2~BLT_K have similar coupling relationships.

The memory cell MC in FIG. 4 is further simplifier. In FIG. 4, the first memory cell MC1 has three terminals coupled to the search line SL, the match line ML and ground. Similarly, the second memory cell MCB1 has three terminals coupled to the search line SLB, the match line ML and ground. In the following, the first memory cell MC1 and the second memory cell MCB1 are paired; and the search lines SL and SLB are also paired.

Figure 5:
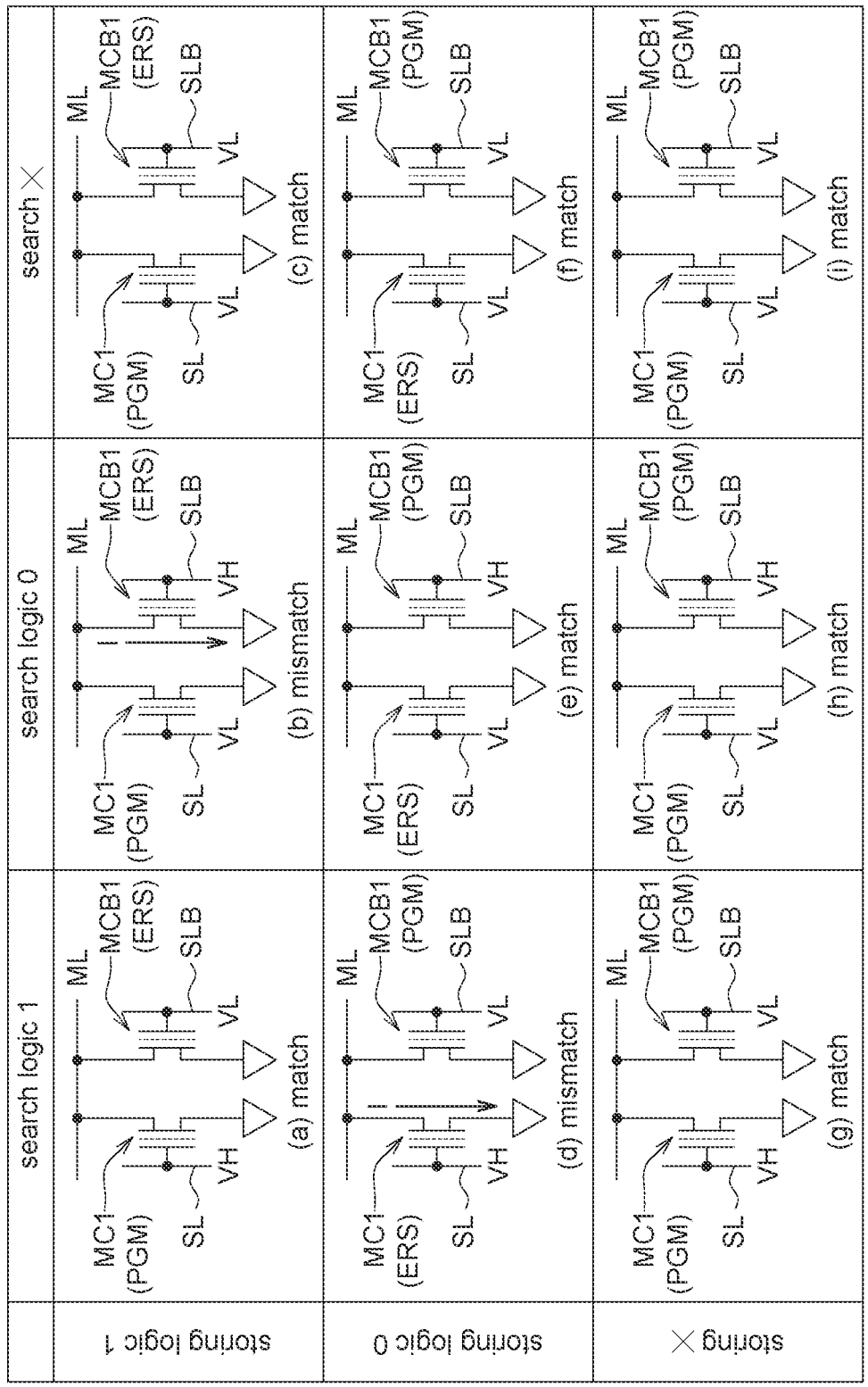
FIG. 5 shows a search truth table according to one embodiment of the application.

FIG. 5 shows a search truth table according to one embodiment of the application. As shown in FIG. 5, "PGM" refers that the memory cell is programmed to logic "1"; and "ERS" refers that the memory cell is erased to logic "0". In cases (a) to (f), the first memory cell MC1 stores logic "1" while the second memory cell MCB1 stores logic "0". In cases (g) to (i), the memory cells MC1 and MCB1 store bit "X" wherein in FIG. 5, the memory cells MC1 and MCB1 are both programmed to logic "1" but in another example, the memory cells MC1 and MCB1 may be both programmed to logic "0".

In one embodiment of the application, in case that the memory cell MC stores logic "1", (1) when the high voltage VH on the search line SL is applied to the memory cell MC, the logic "1" memory cell MC is not turned on; and thus the logic "1" memory cell MC does not generate the cell current; and (2) when the low voltage VL on the search line SL is applied to the memory cell MC, the logic "1" memory cell MC is not turned on; and thus the logic "1" memory cell MC does not generate the cell current. Similarly, in case that the memory cell MC stores logic "0", (1) when the high voltage VH on the search line SL is applied to the memory cell MC, the logic "0" memory cell MC is turned on; and thus the logic "0" memory cell MC generates the cell current; and (2) when the low voltage VL on the search line SL is applied to the memory cell MC, the logic "0" memory cell MC is not turned on; and thus the logic "0" memory cell MC does not generate the cell current.

In case (a), in searching logic "1", the search lines SL and SLB are respectively applied by a high voltage VH (for example but not limited by, 7V) and a low voltage VL (for example but not limited by, 0V). The first and the second memory cells MC1 and MCB1 are both disconnected; and thus neither the first or the second memory cells MC1 and MCB1 generates the cell current. The match line ML is not pulled low. In case (a), the search result is matched.

In case (b), in searching logic "0", the search lines SL and SLB are respectively applied by the low voltage VL and the high voltage VH. The first memory cell MC1 is disconnected; and the second memory cell MCB1 is connected. Thus the second memory cell MCB1 generates the cell current for pulling low the match line ML. In case (b), the search result is mismatched.

In case (c), in searching logic "X" (don't care), the search lines SL and SLB are both applied by the low voltage VL. The first and the second memory cells MC1 and MCB1 are both disconnected; and thus neither the first or the second memory cells MC1 and MCB1 generates the cell current. The match line ML is not pulled low. In case (c), the search result is matched.

In case (d), in searching logic "1", the search lines SL and SLB are respectively applied by the high voltage VH and the low voltage VL. The first memory cell MC1 is connected; and the second memory cell MCB1 is disconnected. Thus the first memory cell MC1 generates the cell current for pulling low the match line ML. In case (d), the search result is mismatched.

In case (e), in searching logic "0", the search lines SL and SLB are respectively applied by the low voltage VL and the high voltage VH. The first and the second memory cells MC1 and MCB1 are both disconnected; and thus neither the first or the second memory cells MC1 and MCB1 generates the cell current. The match line ML is not pulled low. In case (e), the search result is matched.

In case (f), in searching logic "X" (don't care), the search lines SL and SLB are both applied by the low voltage VL. The first and the second memory cells MC1 and MCB1 are both disconnected; and thus neither the first or the second memory cells MC1 and MCB1 generates the cell current. The match line ML is not pulled low. In case (f), the search result is matched.

In case (g), in searching logic "1", the search lines SL and SLB are respectively applied by the high voltage VH and the low voltage VL. The first and the second memory cells MC1 and MCB1 are both disconnected; and thus neither the first or the second memory cells MC1 and MCB1 generates the cell current. The match line ML is not pulled low. In case (g), the search result is matched.

In case (h), in searching logic "0", the search lines SL and SLB are respectively applied by the low voltage VL and the high voltage VH. The first and the second memory cells MC1 and MCB1 are both disconnected; and thus neither the first or the second memory cells MC1 and MCB1 generates the cell current. The match line ML is not pulled low. In case (h), the search result is matched.

In case (i), in searching logic "X" (don't care), the search lines SL and SLB are both applied by the low voltage VL. The first and the second memory cells MC1 and MCB1 are both disconnected; and thus neither the first or the second memory cells MC1 and MCB1 generates the cell current. The match line ML is not pulled low. In case (i), the search result is matched.

Figure 6A:
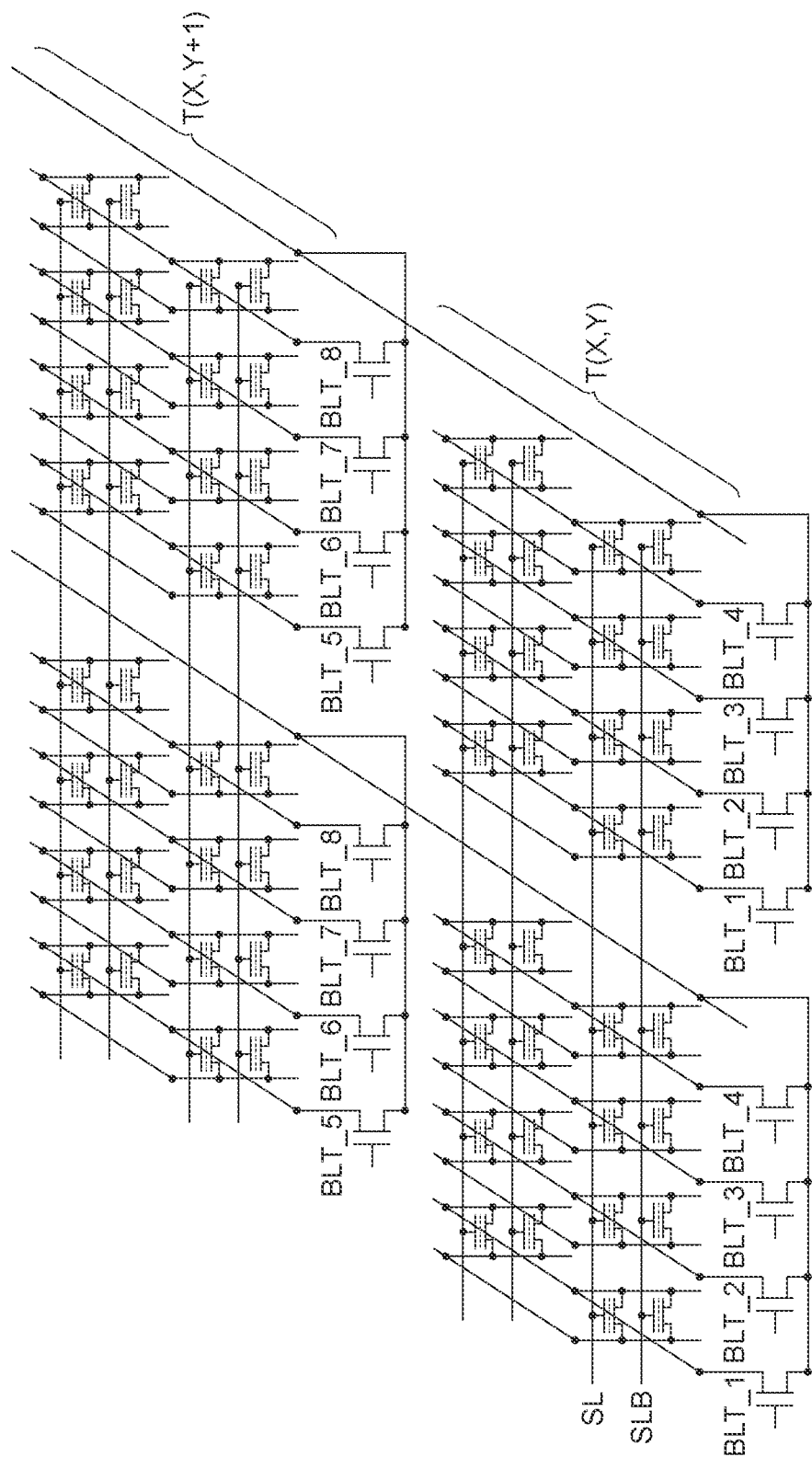
FIG. 6A to FIG. 6C show examples of selecting the word lines as the search lines in multi-bit search according to embodiments of the application.
Figure 6B:
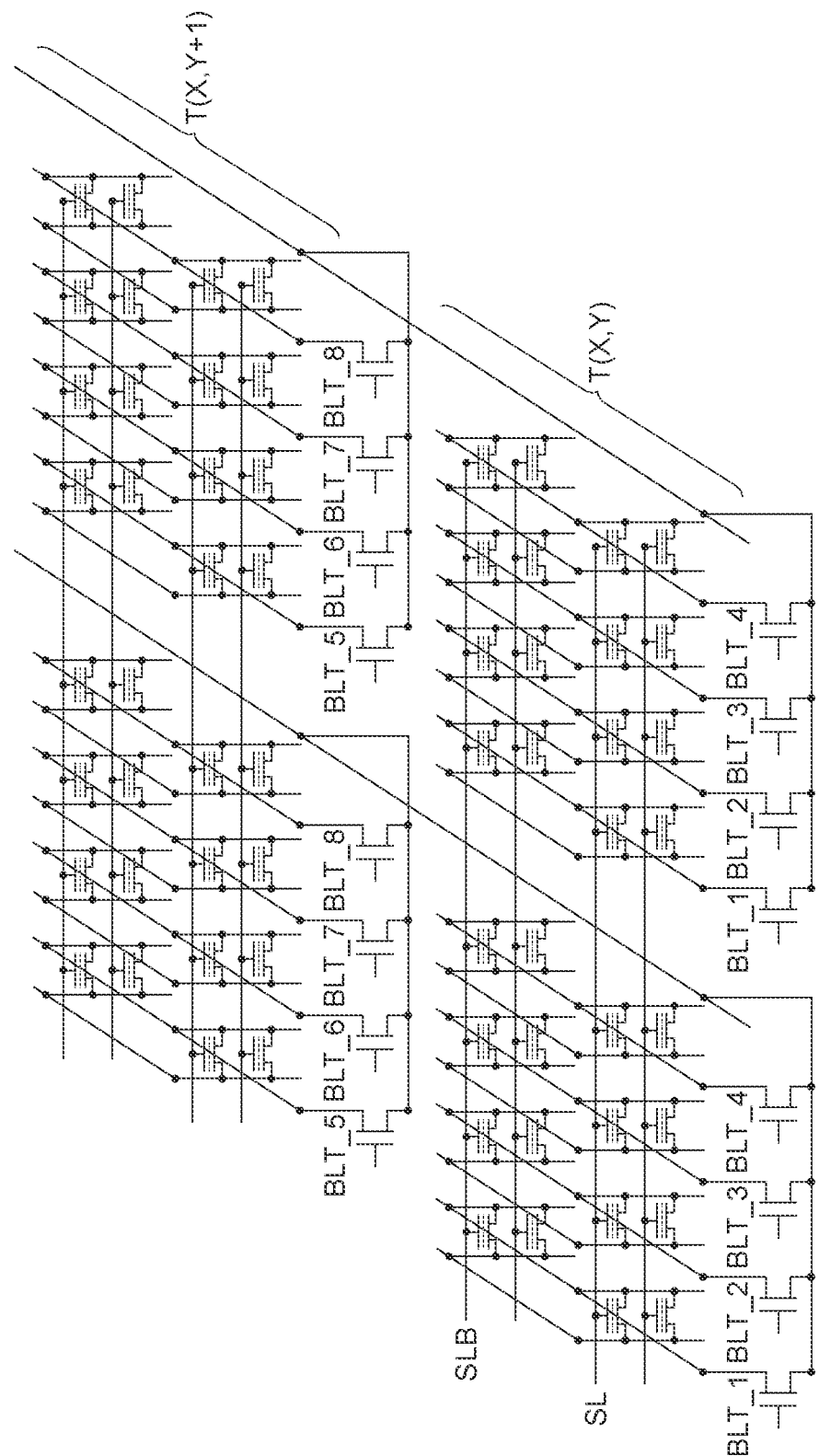
Figure 6C:
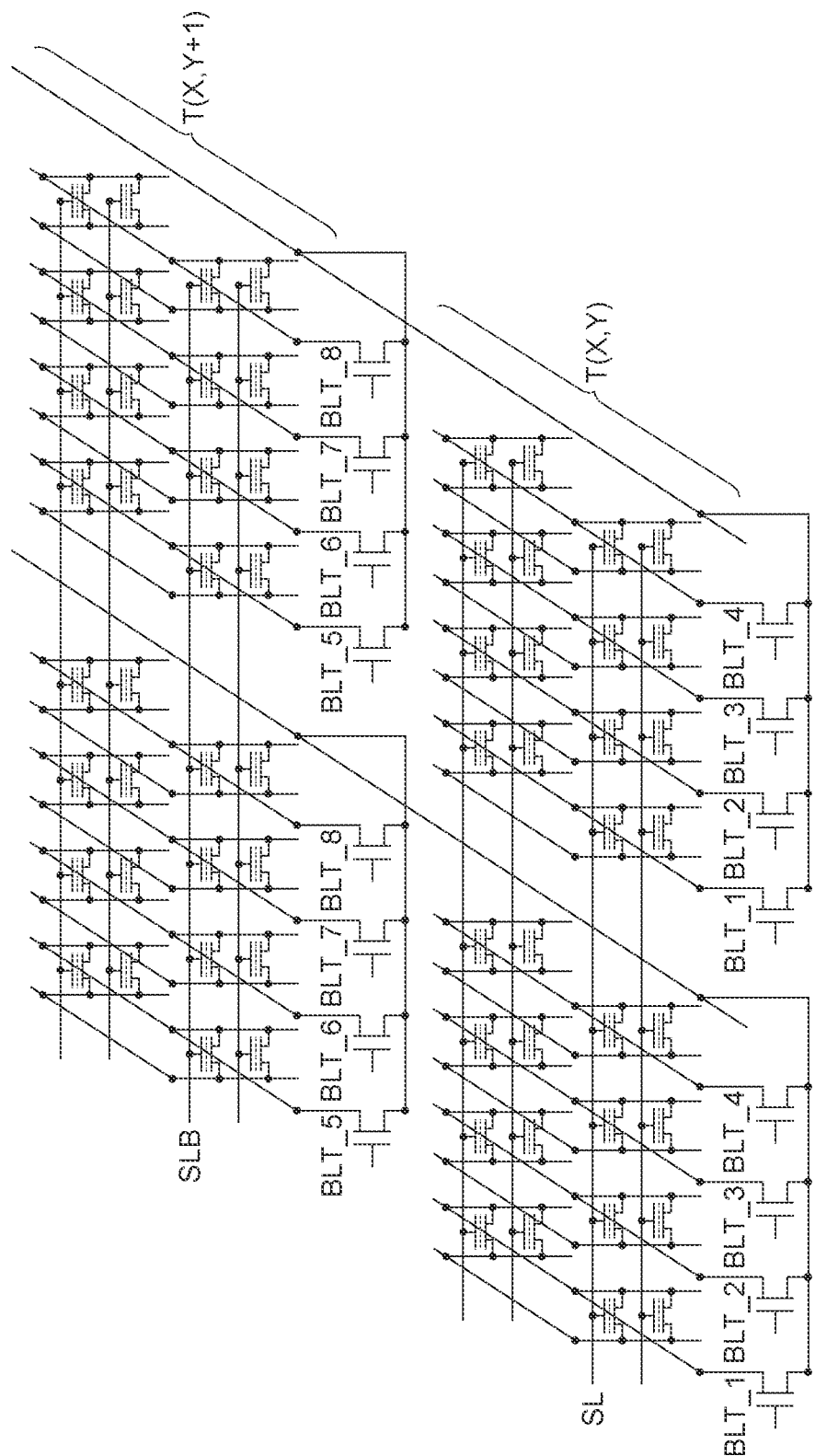

FIG. 6A to FIG. 6C shows examples of selecting the word lines as the search lines in multi-bit search according to embodiments of the application.

As known, a memory array includes a plurality of memory banks; each of the memory banks includes a plurality of memory tiles; and each of the memory tiles includes a plurality of memory slits. Each of the memory slits includes a plurality of memory cells.

FIG. 6A to FIG. 6C show two search lines SL and SLB, but the application is not limited by this. In real practice, more search lines may be included.

In FIG. 6A, in one embodiment of the application, the word lines coupled to the same memory slit of the same memory tile of the same memory bank are selected as the search lines. As shown in FIG. 6A, the selected search lines SL and SLB are coupled to the same memory slit of the same memory tile T(X, Y).

In FIG. 6B, in one embodiment of the application, the word lines coupled to the different memory slits of the same memory tile of the same memory bank are selected as the search lines. As shown in FIG. 6B, the selected search lines SL and SLB are coupled to the different memory slits of the same memory tile T(X, Y).

In FIG. 6C, in one embodiment of the application, the word lines coupled to the different memory tiles of the same memory bank are selected as the search lines. As shown in FIG. 6C, the selected search lines SL and SLB are coupled to the different memory tiles T(X, Y) and T(X, Y+1) of the same memory bank.

In brief, in one embodiment of the application, the selected search lines are coupled to the same memory bank. The same memory bank shares the same global bit line. Thus, in one embodiment of the application, the selected search lines share the same global bit line.

Figure 7A:
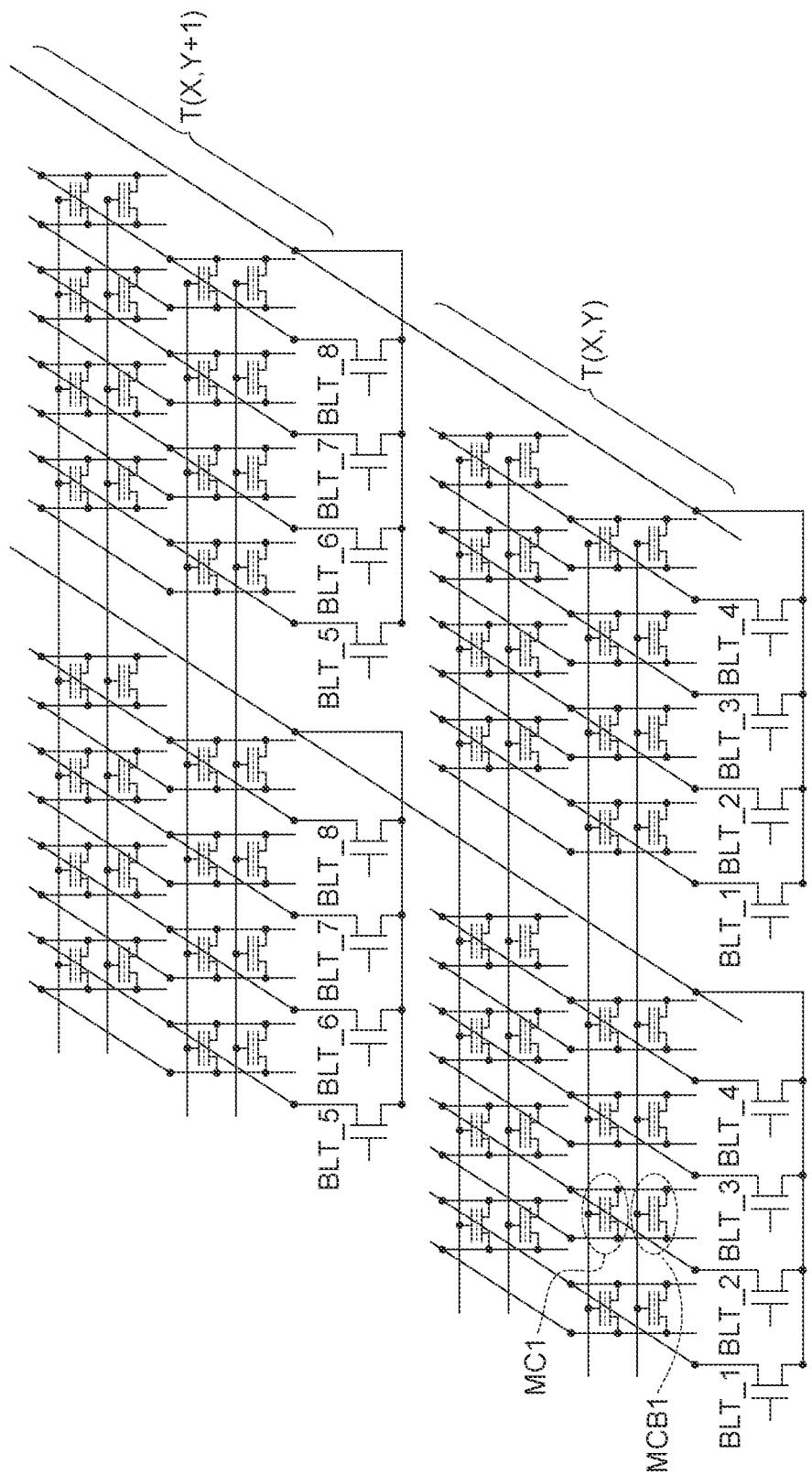
Figure 7C:
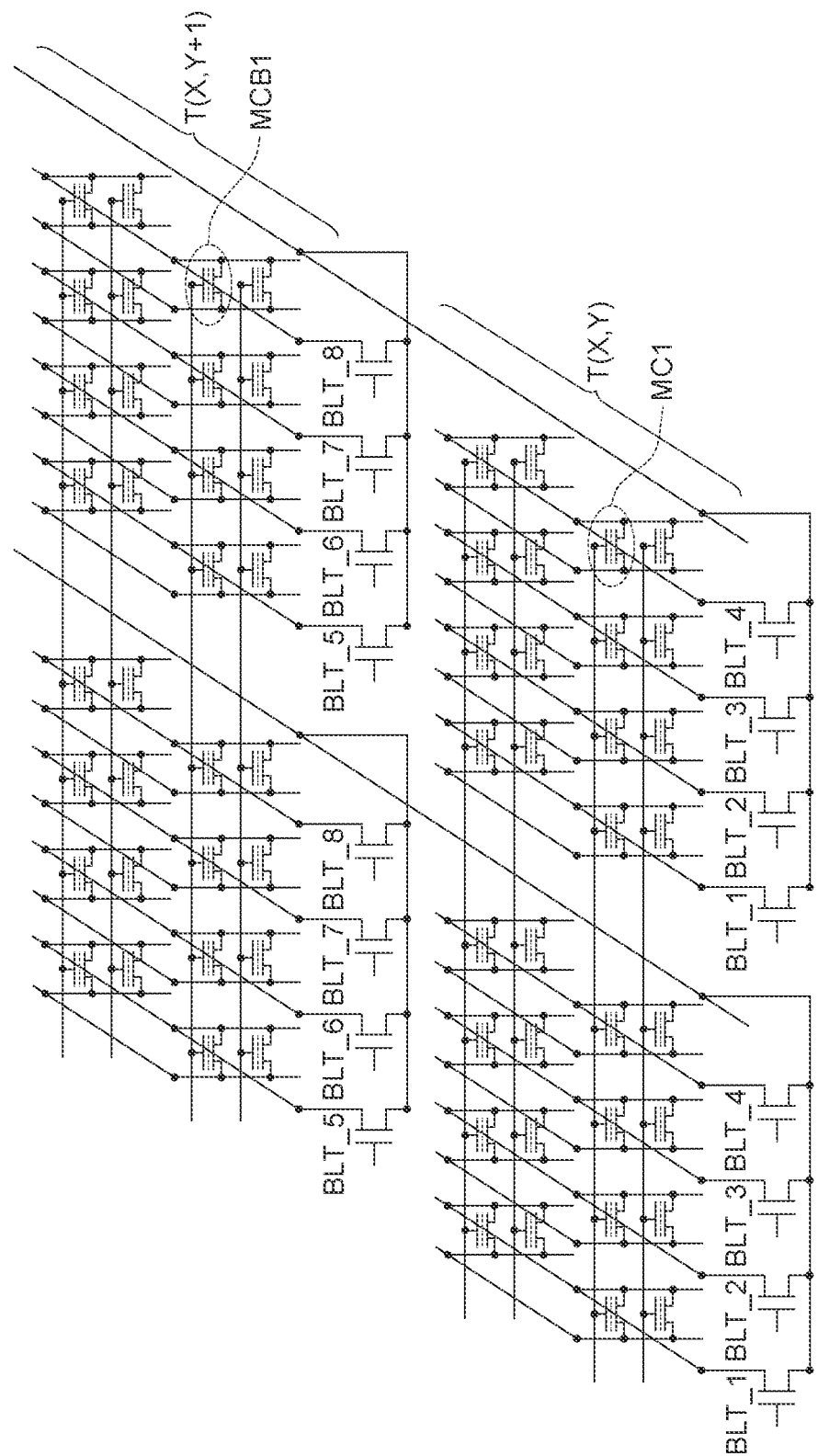

FIG. 7A to FIG. 7C show examples of selecting the memory cells as the data search objects in multi-bit search according to embodiments of the application. FIG. 7A to FIG. 7C shows two memory cells MC1 and MCB1, but the application is not limited by this. In real practice, more memory cells are used.

In FIG. 7A, in one embodiment of the application, the adjacent several memory cells located on the same vertical channel of the same memory slit of the same memory tile of the same memory bank are selected as the data search objects (for example, the memory cells MC1 and the MCB1 in FIG. 5).

In FIG. 7B, in one embodiment of the application, the non-adjacent memory cells of the different memory slits of the same memory tile of the same memory bank are selected as the data search objects.

In FIG. 7C, in one embodiment of the application, the non-adjacent memory cells of the different memory tiles of the same memory bank are selected as the data search objects.

In brief, in one embodiment of the application, the selected memory cells are in the same memory bank.

In other possible embodiment of the application, the examples in FIG. 6A to FIG. 6C may be implemented along with the examples in FIG. 7A to FIG. 7C.

FIG. 8A to FIG. 8I show several examples of selecting the word lines and the memory cells in embodiments of the application.

Figure 8A:
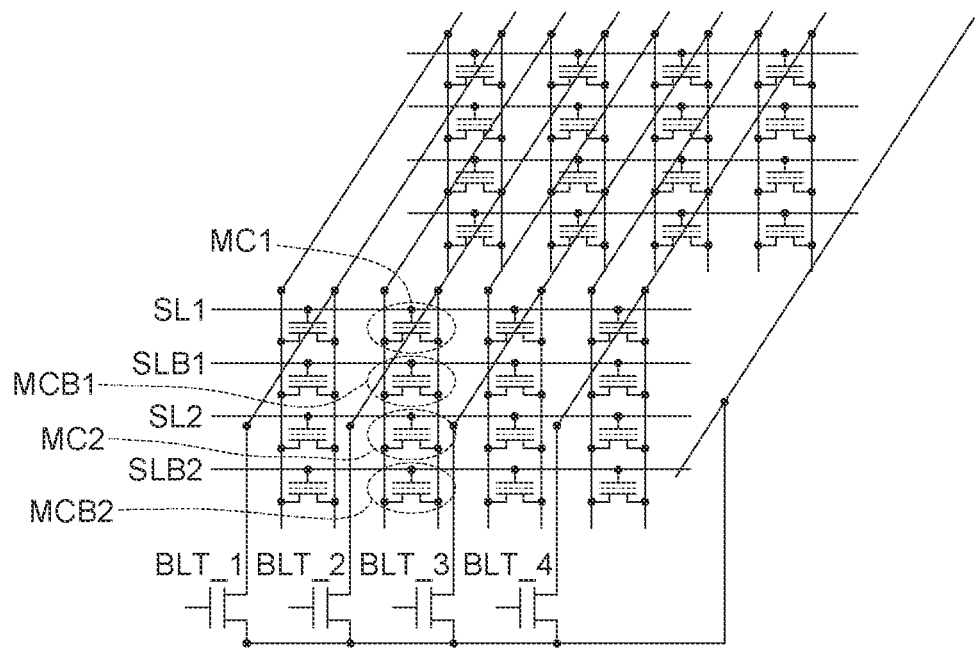
FIG. 8A to FIG. 8I show several examples of selecting the word lines and the memory cells in embodiments of the application.

In FIG. 8A, the word lines coupled to the same memory slit of the same memory tile of the same memory bank are selected as the search lines SLI, SLB1, SL2 and SLB2; and the adjacent several memory cells MC1, MCB1, MC2 and MCB2 located on the same vertical channel of the same memory slit of the same memory tile of the same memory bank are selected. The search lines SLI and SLB1 are paired; and the search lines SL2 and SLB2 are paired. The memory cells MC1 and MCB1 are paired; and the memory cells MC2 and MCB2 are paired.

Figure 8B:
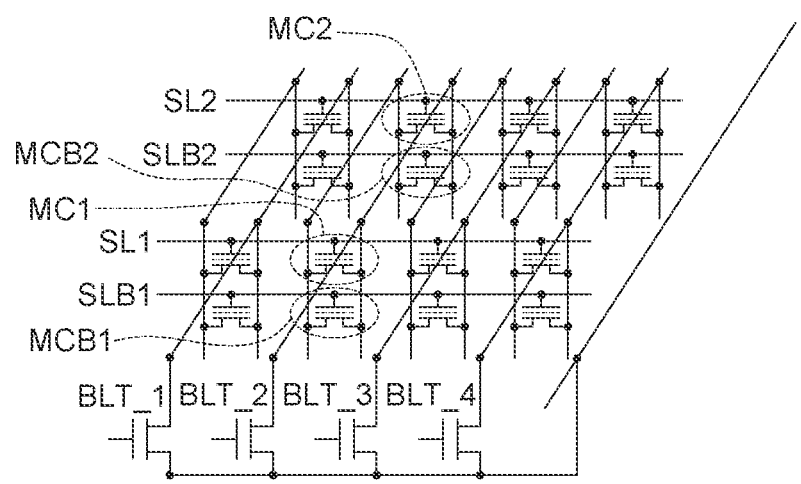

In FIG. 8B, the word lines coupled to the same memory slit of the same memory tile of the same memory bank are selected as the search lines SL1, SLB1, SL2 and SLB2; and the non-adjacent memory cells MC1, MCB1, MC2 and MCB2 of the different memory slits of the same memory tile of the same memory bank are selected.

Figure 8C:
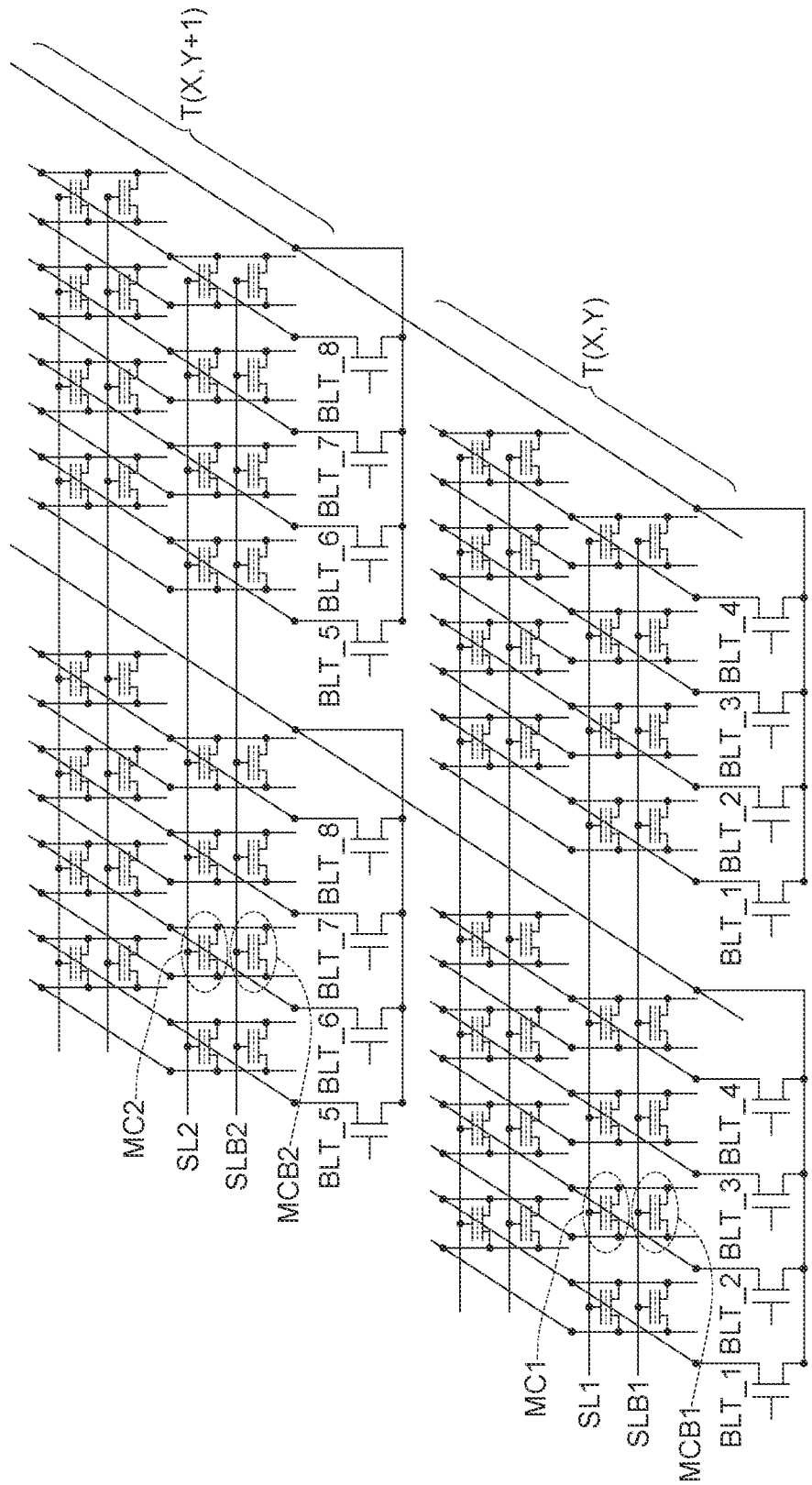

In FIG. 8C, the word lines coupled to the same memory slit of the same memory tile of the same memory bank are selected as the search lines SLI, SLB1, SL2 and SLB2; and the non-adjacent memory cells MC1, MCB1, MC2 and MCB2 of the different memory tiles of the same memory bank are selected.

Figure 8D:
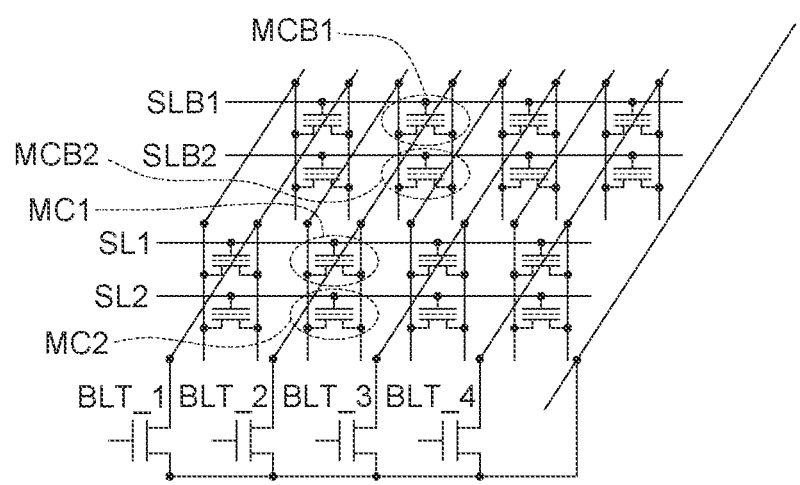

In FIG. 8D, the word lines coupled to the different memory slits of the same memory tile of the same memory bank are selected as the search lines SL1, SLB1, SL2 and SLB2; and the adjacent several memory cells MC1, MCB1, MC2 and MCB2 located on the same vertical channel of the same memory slit of the same memory tile of the same memory bank are selected.

Figure 8E:
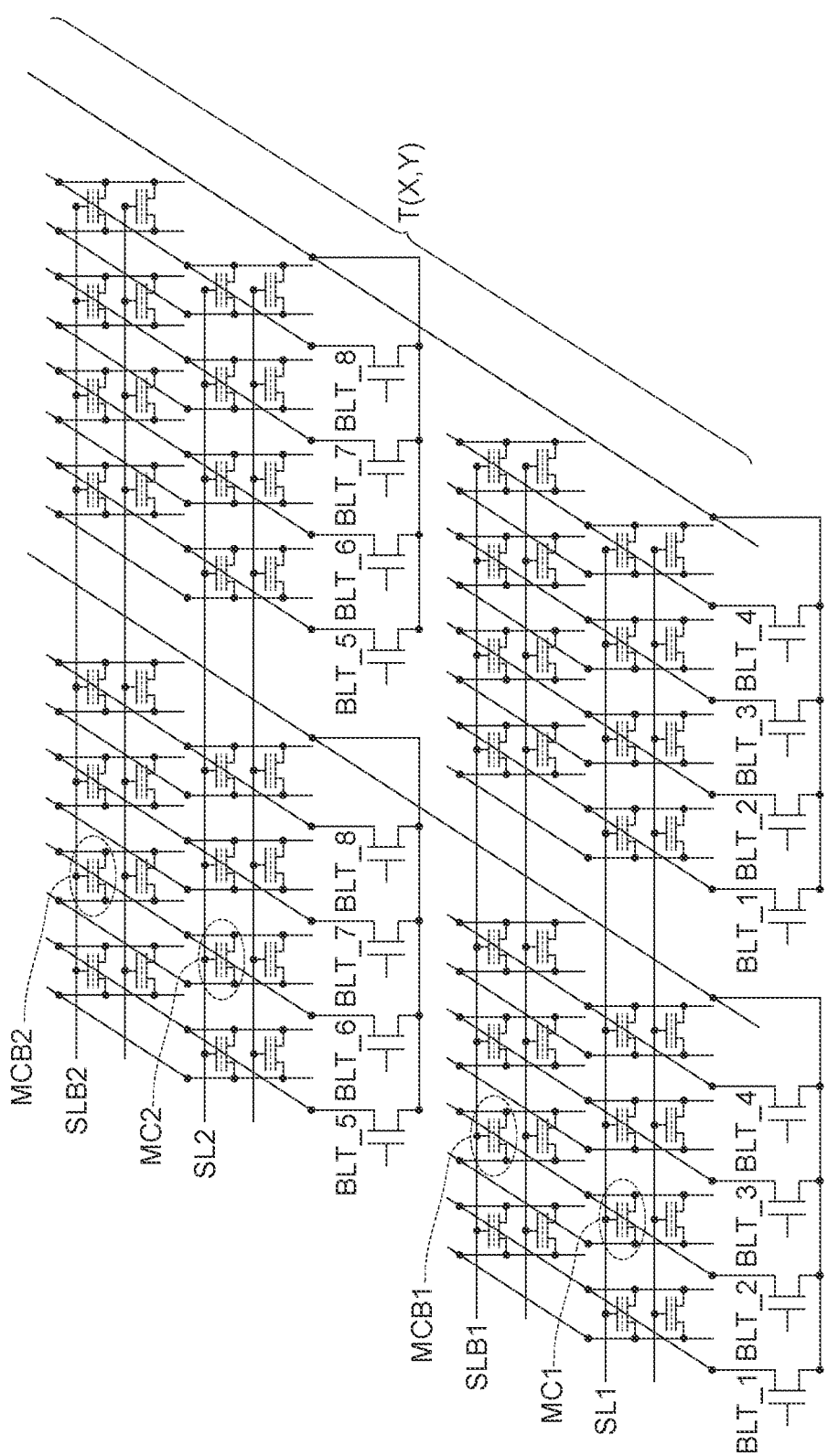

In FIG. 8E, the word lines coupled to the different memory slits of the same memory tile of the same memory bank are selected as the search lines SL1, SLB1, SL2 and SLB2; and the non-adjacent memory cells MC1, MCB1, MC2 and MCB2 of the different memory slits of the same memory tile of the same memory bank are selected.

Figure 8F:
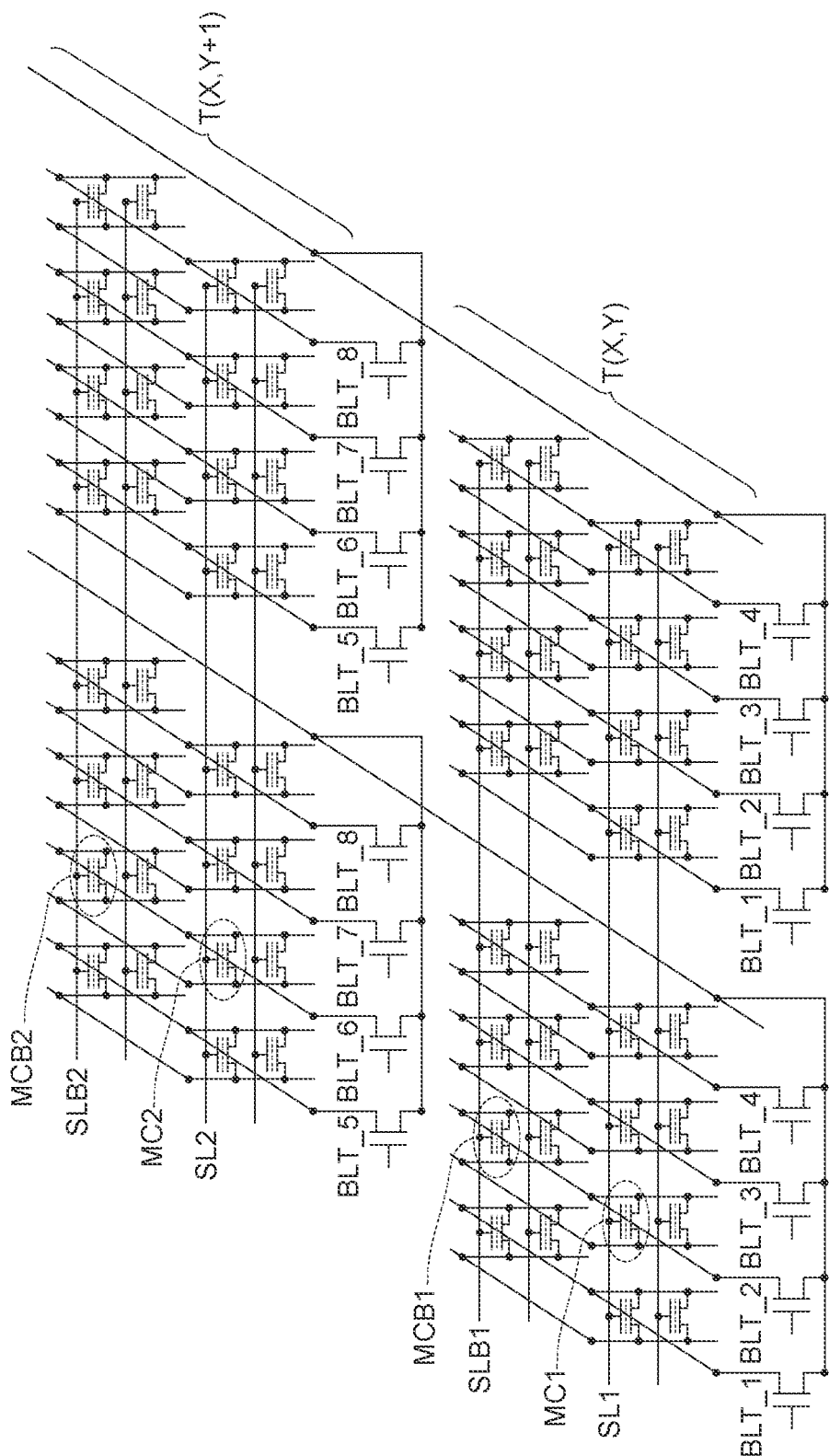

In FIG. 8F, the word lines coupled to the different memory slits of the same memory tile of the same memory bank are selected as the search lines SL1, SLB1, SL2 and SLB2; and the non-adjacent memory cells MC1, MCB1, MC2 and MCB2 of the different memory tiles of the same memory bank are selected.

Figure 8G:
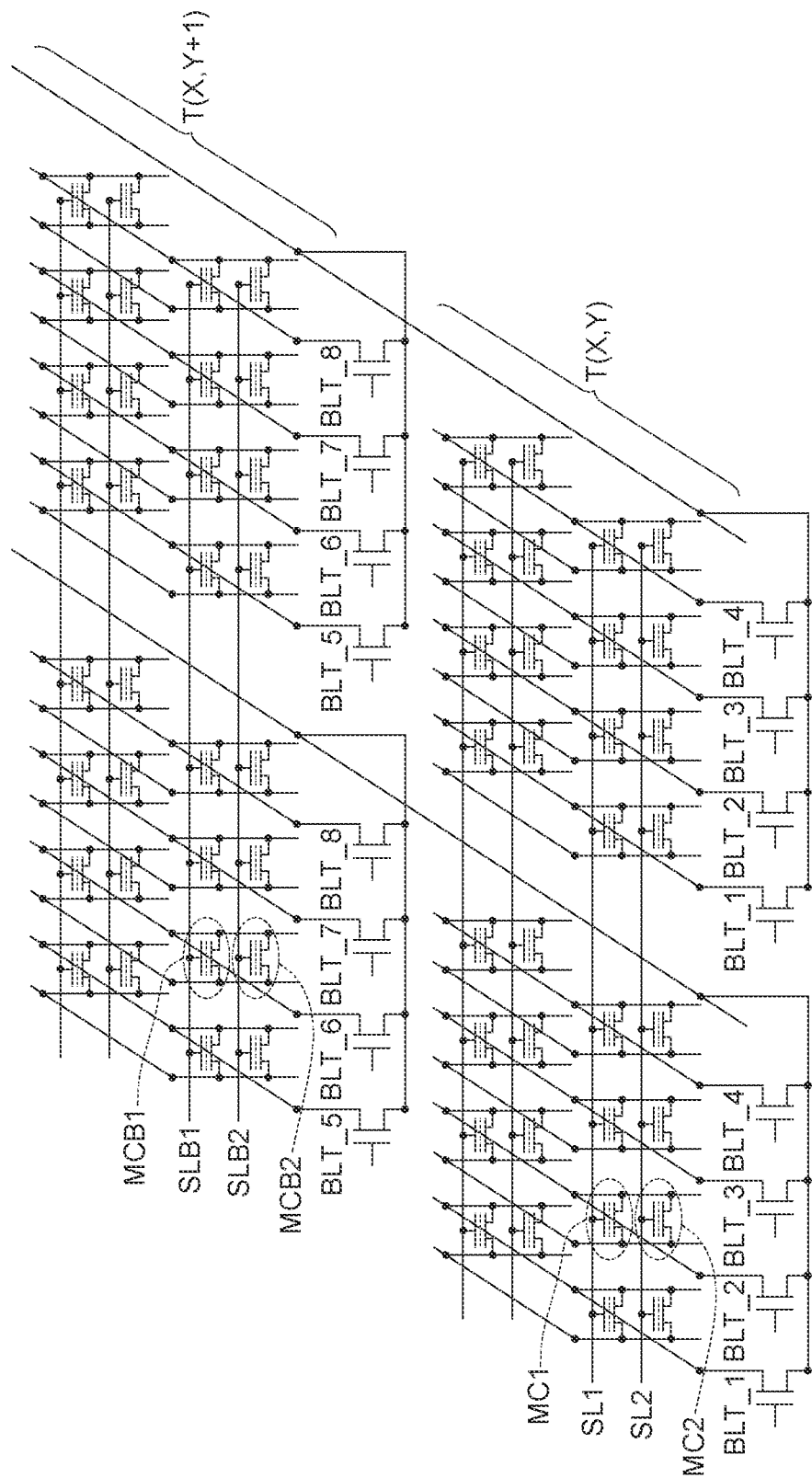

In FIG. 8G, the word lines coupled to the different memory tiles of the same memory bank are selected as the search lines SL1, SLB1, SL2 and SLB2; and the adjacent several memory cells MC1, MCB1, MC2 and MCB2 located on the same vertical channel of the same memory slit of the same memory tile of the same memory bank are selected.

Figure 8H:
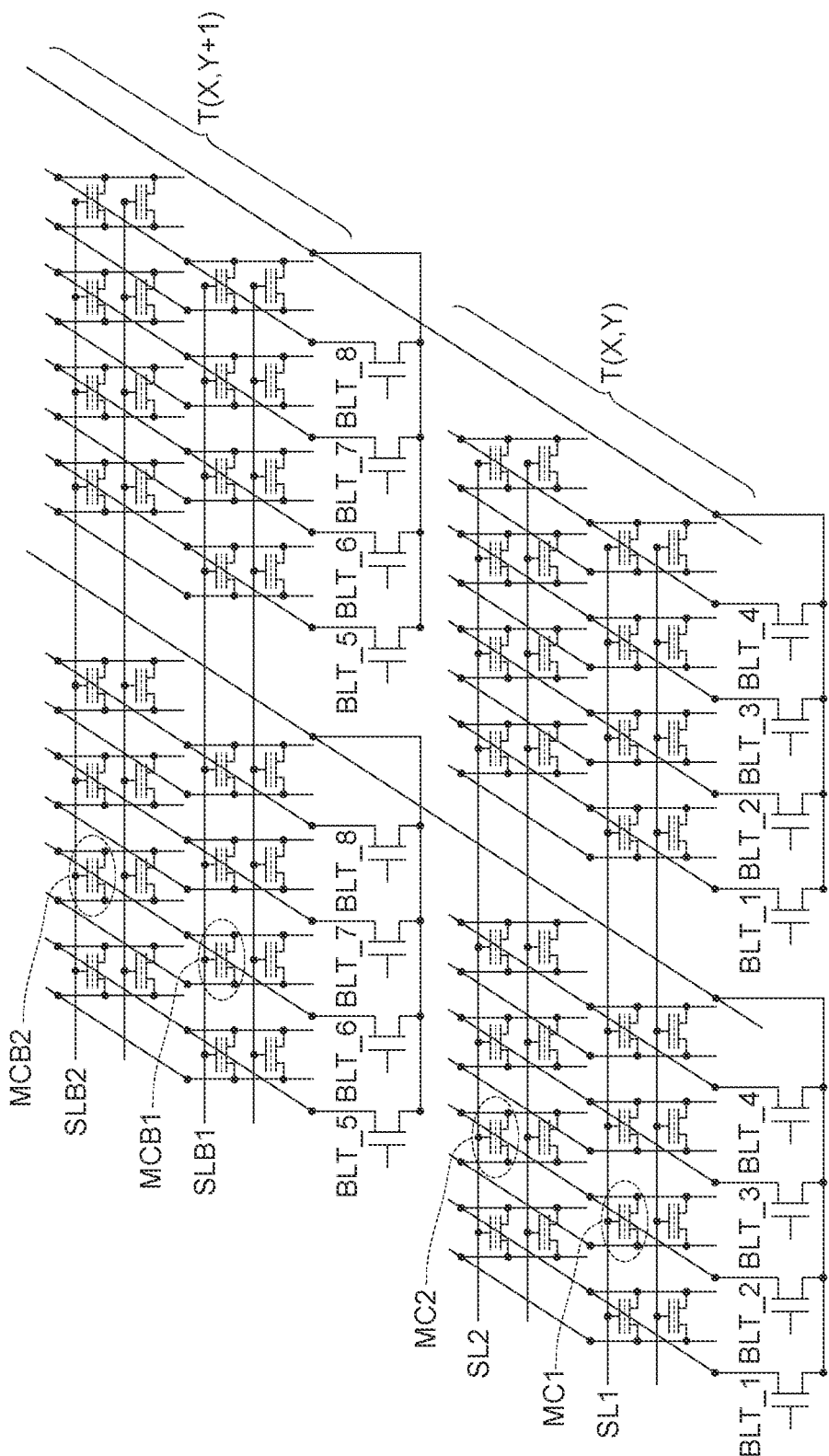

In FIG. 8H, the word lines coupled to the different memory tiles of the same memory bank are selected as the search lines SL1, SLB1, SL2 and SLB2; and the non-adjacent memory cells MC1, MCB1, MC2 and MCB2 of the different memory slits of the same memory tile of the same memory bank are selected.

Figure 8I:
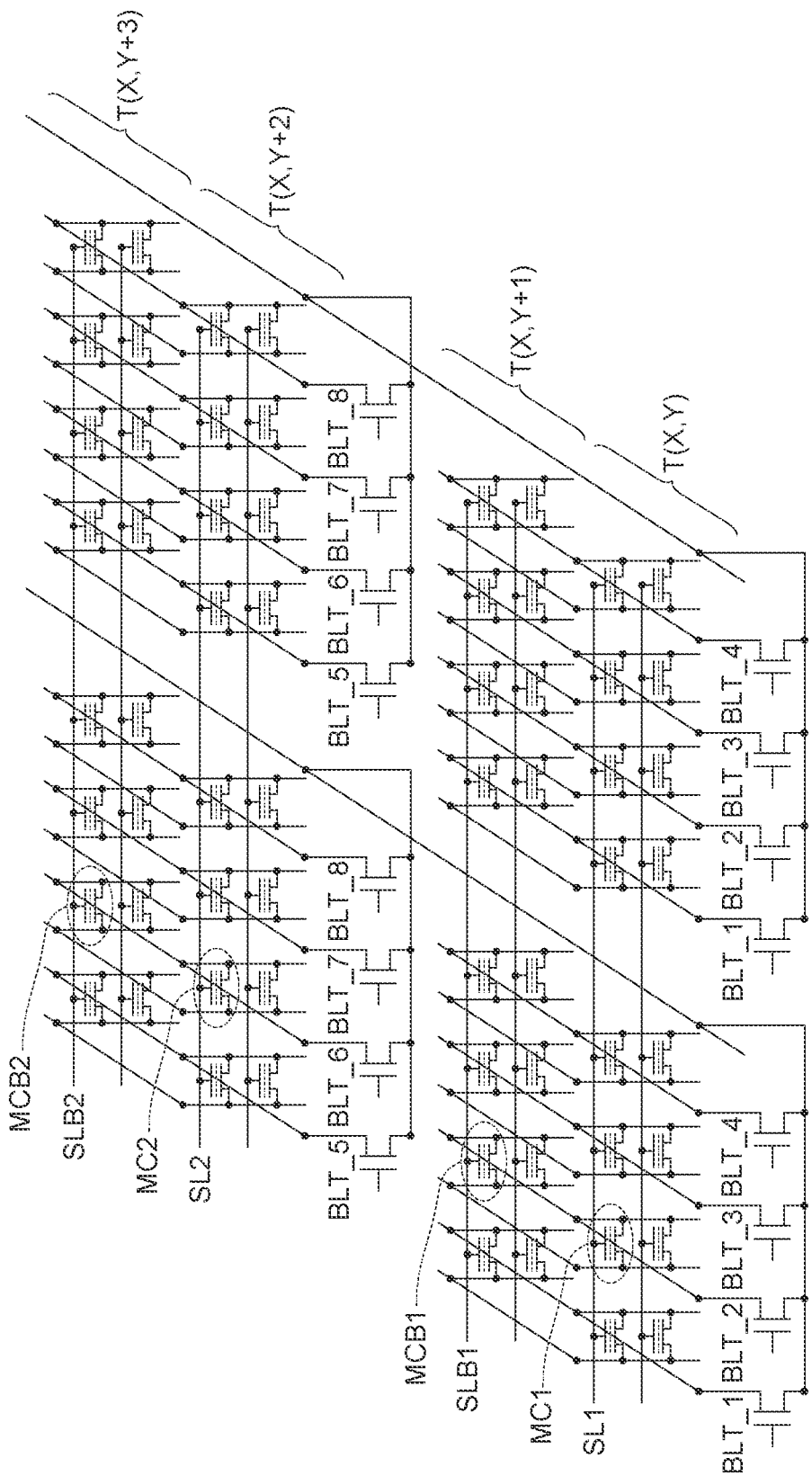

In FIG. 8I, the word lines coupled to the different memory tiles of the same memory bank are selected as the search lines SL1, SLB1, SL2 and SLB2; and the non-adjacent memory cells MC1, MCB1, MC2 and MCB2 of the different memory tiles of the same memory bank are selected.

The above is for examples and the application still has other possible embodiments.

In one embodiment of the application, in multi-bit search, via the above searches, when the search result of the memory cells is matched, the address encoder 132 generates the match address MA.

In one embodiment of the application, other operations of the memory array 110 may the same or the like with operations of a normal NOR memory array.

In the above and other possible embodiments of the application, in implementing TCAM functions on 3D AND memory array, the word lines are selected as the search lines and the global bit lines are selected as the match lines.

In one embodiment of the application, to identify the search results, the selected memory cells share the same global bit line. In search operations, the global bit line is precharged to a high voltage. In mismatch cases, the global bit line is pulled low. By this, the search result is identified as matched or mismatched.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A three-dimension (3D) memory device, comprising:
a memory array including a plurality of memory cells;
a controller coupled to the memory array; and
a match circuit coupled to memory array,
wherein in data search and match, the controller selects from the memory cells a plurality of target memory cells sharing a same target global signal line, and the controller selects a plurality of target word lines sharing the target global signal line as a plurality of target search lines, wherein a search data sends to the target memory cells via the target search lines for data matching;
the target global signal line is precharged;
outputting a match address based on whether a voltage on the target global signal line is pulled down or not; and
in selecting the target search lines, the controller selects as the targets search lines the target word lines coupled to a same memory bank.

2. The 3D memory device according to claim 1, wherein in selecting the target search lines, the controller selects as the targets search lines the target word lines coupled to a same memory slit of a same memory tile of the same memory bank.

3. The 3D memory device according to claim 1, wherein in selecting the target search lines, the controller selects as the targets search lines the target word lines coupled to different memory slits of a same memory tile of the same memory bank.

4. The 3D memory device according to claim 1, wherein in selecting the target search lines, the controller selects as the targets search lines the target word lines coupled to different memory tiles of the same memory bank.

5. The 3D memory device according to claim 1, wherein in selecting the target memory cells, the controller selects as the target memory cells a plurality of adjacent memory cells located on a same vertical channel of a same memory slit of a same memory tile of the same memory bank.

6. The 3D memory device according to claim 1, wherein in selecting the target memory cells, the controller selects as the target memory cells a plurality of non-adjacent memory cells of different memory slits of a same memory tile of the same memory bank.

7. The 3D memory device according to claim 1, wherein in selecting the target memory cells, the controller selects as the target memory cells a plurality of memory cells of different memory tiles of the same memory bank.

8. An operation method for a three-dimension (3D) memory device, comprising:
in data search and match, selecting a plurality of target memory cells sharing a same target global signal line, and selecting a plurality of target word lines sharing the target global signal line as a plurality of target search lines, wherein a search data sends to the target memory cells via the target search lines for data matching;
precharging the target global signal line; and
outputting a match address based on whether a voltage on the target global signal line is pulled down or not; and
in selecting the target search lines, the target word lines coupled to a same memory bank are selected as the targets search lines.

9. The operation method for the 3D memory device according to claim 8, wherein in selecting the target search lines, selecting as the targets search lines the target word lines coupled to a same memory slit of a same memory tile of the same memory bank.

10. The operation method for the 3D memory device according to claim 8, wherein in selecting the target search lines, selecting as the targets search lines the target word lines coupled to different memory slits of a same memory tile of the same memory bank.

11. The operation method for the 3D memory device according to claim 8, wherein in selecting the target search lines, selecting as the targets search lines the target word lines coupled to different memory tiles of the same memory bank.

12. The operation method for the 3D memory device according to claim 8, wherein in selecting the target memory cells, selecting as the target memory cells a plurality of adjacent memory cells located on a same vertical channel of a same memory slit of a same memory tile of the same memory bank.

13. The operation method for the 3D memory device according to claim 8, wherein in selecting the target memory cells, selecting as the target memory cells a plurality of non-adjacent memory cells of different memory slits of a same memory tile of the same memory bank.

14. The operation method for the 3D memory device according to claim 8, wherein in selecting the target memory cells, selecting as the target memory cells a plurality of memory cells of different memory tiles of the same memory bank.

\* \* \* \* \*